United States Patent
Weloth et al.

(10) Patent No.: US 12,381,118 B2
(45) Date of Patent: Aug. 5, 2025

(54) 3D MULTIPLE LOCATION COMPRESSING BONDED ARM FOR ADVANCED INTEGRATION

(71) Applicant: Tokyo Electron Limited, Tokyo (JP)

(72) Inventors: Andrew Weloth, Albany, NY (US); Daniel Fulford, Ballston Lake, NY (US); Anthony Schepis, Averill Park, NY (US); Mark I. Gardner, Cedar Creek, TX (US); H. Jim Fulford, Marianna, FL (US); Anton Devilliers, Clifton Park, NY (US); David Conklin, Saratoga Springs, NY (US)

(73) Assignee: Tokyo Electron Limited, Tokyo (JP)

( * ) Notice: Subject to any disclaimer, the term of this patent is extended or adjusted under 35 U.S.C. 154(b) by 392 days.

(21) Appl. No.: 18/081,207

(22) Filed: Dec. 14, 2022

(65) Prior Publication Data

US 2024/0203797 A1 Jun. 20, 2024

(51) Int. Cl.
| | | |
|---|---|---|
| H01L 21/66 | (2006.01) | |
| G03F 7/00 | (2006.01) | |
| H01L 21/02 | (2006.01) | |
| H01L 21/67 | (2006.01) | |

(52) U.S. Cl.
CPC ............ H01L 22/20 (2013.01); G03F 7/0035 (2013.01); H01L 21/02002 (2013.01); H01L 21/67092 (2013.01); H01L 21/67288 (2013.01)

(58) Field of Classification Search
CPC . H01L 21/185; H01L 21/187; H01L 21/2007; H01L 2224/828; H01L 21/67288; H01L 22/20; H01L 21/02002; H01L 21/67092; H01L 22/12; B81C 2203/0118; G05B 2219/37224

See application file for complete search history.

(56) References Cited

U.S. PATENT DOCUMENTS

| | | |
|---|---|---|
| 9,184,041 B2 | 11/2015 | Chen et al. |
| 10,276,513 B2 | 4/2019 | Chen et al. |
| 10,833,026 B2 | 11/2020 | Chen et al. |
| 11,335,607 B2 | 5/2022 | Ip |
| 11,410,948 B2 | 8/2022 | Chen et al. |
| 2007/0287264 A1 | 12/2007 | Rogers |

(Continued)

FOREIGN PATENT DOCUMENTS

CN 108376652 A 8/2018

OTHER PUBLICATIONS

International Search Report and Written Opinion issued Mar. 22, 2024, in PCT/US2023/081099, 8 pages.

*Primary Examiner* — John P. Dulka
(74) *Attorney, Agent, or Firm* — Oblon, McClelland, Maier & Neustadt, L.L.P.

(57) ABSTRACT

Aspects of the present disclosure provide a bonding device for bonding two wafers. For example, the bonding device can include a first bonding chuck and a second bonding chuck. The first bonding chuck can have a first bonding head for a first wafer to be mounted thereon. The second bonding chuck can have a plurality of second bonding heads for a second wafer to be mounted thereon. The second bonding heads can be controlled individually to apply local pressures onto the second wafer to move the second wafer toward the first wafer to bond the second wafer to the first wafer, the local pressures corresponding to bow measurement of the first wafer and the second wafer.

12 Claims, 10 Drawing Sheets

(56) References Cited

U.S. PATENT DOCUMENTS

| | | |
|---|---|---|
| 2014/0374879 A1 | 12/2014 | Chen et al. |
| 2016/0035682 A1 | 2/2016 | Chen et al. |
| 2017/0243836 A1 | 8/2017 | Chen et al. |
| 2019/0148184 A1* | 5/2019 | Sugaya .............. H01L 21/6831 438/455 |
| 2019/0244914 A1 | 8/2019 | Chen et al. |
| 2021/0091022 A1 | 3/2021 | Chen et al. |
| 2022/0013416 A1 | 1/2022 | Ip |

* cited by examiner

3D MULTIPLE LOCATION COMPRESSING BONDED ARM FOR ADVANCED INTEGRATION

FIELD OF THE INVENTION

The present disclosure relates to semiconductor fabrication, and, more particularly, to wafer bowing, wafer-to-wafer bonding and wafer-to-die bonding.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Exposure systems (also called tools) are used to implement photolithographic techniques. An exposure system typically includes an illumination system, a reticle (also called a photomask) or spatial light modulator (SLM) for creating a circuit pattern, a projection system, and a wafer alignment stage for aligning a photosensitive resist-covered semiconductor wafer. The illumination system illuminates a region of the reticle or SLM with a (preferably) rectangular slot illumination field. The projection system projects an image of the illuminated region of the reticle pattern onto the wafer. For accurate projection, it is important to expose a pattern of light on a wafer that is relatively flat or planar, preferably having less than 10 microns of height deviation. Bonding of two or more semiconductor wafers and/or dies offer higher performance for high density semiconductor devices.

SUMMARY

Aspects of the present disclosure provide a system for bonding two wafers. For example, the system can include a bow measurement device, a bonding device and a controller. The bow measurement device can be configured to measure a first wafer and a second wafer to identify bow measurement of the first wafer and the second wafer. The bonding device can be configured to bond the first wafer to the second wafer. The controller can be coupled to the bow measurement device and the bonding device, and configured to control the bonding device to apply pressures onto the first wafer and the second wafer based on the bow measurement to bond the first wafer to the second wafer. In an embodiment, the second wafer is a die.

In an embodiment, the system can further include a film formation device coupled to the controller, the film formation device configured to form a bonding film on first surfaces of the first wafer and the second wafer. For example, the system can further include a heat generator coupled to the controller, the heat generator configured to generate a pattern of heat, wherein the film formation device is further configured to form first and second stress-modification films on second surfaces of the first wafer and the second wafer, respectively, the first and second stress-modification films reactive to heat such that applied heat modifies internal stresses of the first and second stress-modification films, the bow measurement device is further configured to measure the first wafer and the second wafer, with the first and second stress-modification films on the second surfaces thereof, respectively, and having their internal stress modified, to identify the bow measurement of the first wafer and the second wafer, the bow measurement device is further configured to measure the first wafer and the second wafer, without any stress-modification film formed on the second surfaces thereof, to identify another bow measurement of the first wafer and the second wafer, and the controlled is further configured to control the heat generator to generate and apply the pattern of heat onto the first and second stress-modification films, the pattern of heat corresponding to the another bow measurement. As another example, the system can further include a light generator coupled to the controller, the light generator configured to generate a pattern of first and second wavelengths of light, wherein the film formation device is further configured to form first and second stress-modification films on second surfaces of the first wafer and the second wafer, respectively, the first and second stress-modification films reactive to the first and second wavelengths of light, respectively, such that exposure to the first and second wavelengths of light modifies internal stresses of the first and second stress-modification films, respectively, the bow measurement device is further configured to measure the first wafer and the second wafer, with the first and second stress-modification films formed on the second surfaces thereof, respectively, and having their internal stresses modified, to identify the bow measurement of the first wafer and the second wafer, the bow measurement device is further configured to measure the first wafer and the second wafer, without any stress-modification film formed on the second surfaces thereof, to identify another bow measurement of the first wafer and the second wafer, and the controlled is further configured to control the light generator to generate and apply the pattern of first and second wavelengths of light onto the first and second stress-modification films, respectively, the pattern of first and second wavelengths of light corresponding to the another bow measurement.

Aspects of the present disclosure provide a method for bonding two wafers. For example, the method can include receiving a first wafer and a second wafer, measuring the first wafer and the second wafer to identify bow measurement of the first wafer and the second wafer, and applying pressures onto second surfaces of the first wafer and the second wafer based on the bow measurement of the first wafer and the second wafer to bond the first wafer to the second wafer.

In an embodiment, the method can further include forming a bonding film on a first surface of the first wafer. For example, the method can further include measuring the first wafer, without any stress-modification film formed on a second surface thereof, to identify another bow measurement of the first wafer, forming a stress-modification film on the second surface of the first wafer, the stress-modification film reactive to heat such that applied heat modifies an internal stress of the stress-modification film, and applying a pattern of heat onto the stress-modification film to modify the internal stress of the stress-modification film, the pattern of heat corresponding to the another bow measurement, wherein measuring the first wafer and the second wafer to identify the bow measurement of the first wafer and the second wafer includes measuring the first wafer and the second wafer, with the stress-modification film formed on the second surface of the first wafer and having its internal stress modified, to identify the bow measurement of the first wafer and the second wafer. As another embodiment, the method can further include measuring the first wafer, without any stress-modification film formed on a second surface thereof, to identify another bow measurement of the first wafer, forming a stress-modification film on the second surface of the first wafer, the stress-modification film reactive to a wavelength of light in that exposure to the wavelength of light modifies an internal stress of the stress-modification film, and applying a pattern of wavelength of light onto the stress-modification film to modify the internal stress of the stress-modification film, the pattern of wavelength of light corresponding to the another bow measurement, wherein measuring the first wafer and the second wafer to identify the bow measurement of the first wafer and the second wafer includes measuring the first wafer and the second wafer, with the stress-modification film formed on the second surface of the first wafer and having its internal stress modified, to identify the bow measurement of the first wafer and the second wafer.

In an embodiment, the method can further include measuring another die to identify another bow measurement of the another die, and applying another pressures onto a first surface of the another die based on the another bow measurement to bond the another die to the die. In another embodiment, the method can further include measuring another die to identify another bow measurement of the another die, and applying another pressures onto a first surface of the another die based on the another bow measurement to bond the another die to the second wafer.

Aspects of the present disclosure provide a bonding device for bonding two wafers. For example, the bonding device can include a first bonding chuck and a second bonding chuck. The first bonding chuck can have a first bonding head for a first wafer to be mounted thereon. The second bonding chuck can have a plurality of second bonding heads for a second wafer to be mounted thereon. The second bonding heads can be configured to be controlled individually to apply local pressures onto the second wafer to move the second wafer toward the first wafer to bond the second wafer to the first wafer, the local pressures corresponding to bow measurement of the first wafer and the second wafer.

In an embodiment, the first bonding head can apply a global pressure onto the first wafer to move the first wafer toward the second wafer to bond the first wafer to the second wafer. In another embodiment, the first bonding chuck can further include one or more heating units that are disposed in the first bonding head, the heating units configured to provide heat to cure a bonding film that is used to bond the first wafer to the second wafer.

In an embodiment, the second wafer can be a die, and the second bonding heads can be disposed in an arrangement that is sized to the die. In another embodiment, a first one of the second bonding heads can be in a first shape, and a second one of the second bonding heads can be in a second shape different from the first shape. For example, the first shape can be round, rectangular or crescent.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

To achieve the best resolution using a mask with a laser or EMS $\lambda$ (electromagnetic spectrum wavelength) sensitive lithographic emulsion to define areas that are either blocked or opened for a subsequent pattern transfer or implant requires the wafer surface to be of optimum shape prior to the photo/lithographic process. Techniques disclosed herein include stress modulation of films on a wafer to achieve a target curvature or correction. Techniques herein can use all types of light sensitive wavelengths/lithography types in the electromagnetic spectrum (some examples are photo lithography, e-beam lithography, direct laser write, and x-ray lithography). Techniques disclosed herein also include applying local pressures to two wafers based on bow measurement of the two wafers to bond them to each other such that the two wafers thus bonded have optimum wafers shape.

Techniques disclosed herein define several process flows to achieve the optimum starting wafer shape (using semiconductor stress film tuning, or tuning the lattice thereof) prior to the photo process that is used on the working surface of the wafer. Process flows herein include a disposable stress tuning film on the backside surface of a wafer as one option. Another option is to leave the stress tuning film in place for subsequent processing to be used in some cases where low temp processing is possible for several steps.

By using a lithographic film that may be patterned either with a mask or direct write with lithographic stress film feature. One unique aspect herein is the deposited lithographic film can be either compressive, tensile, or neutral stress in the deposited condition as a lithographic emulsion sensitive to a certain laser or EM wavelength. Thus the micro stress regions may be defined by either mask and etch of the deposited film, or direct write regions where selective compressive/neutral/tensile regions are desired (or direct write options). The process may be also be replicated with two different depositions (i.e. one sensitive to a first laser wavelength, the other sensitive to a second laser wavelength) to eliminate wafer bow post laser treatment.

Techniques herein include wafer stress modification techniques to modify wafer bowing and curvature to improve wafer overlay. Stress film deposition can be executed with wafer surface up or down as options for all process flows for all flows with clamped wafer option. Techniques herein also include bonding two wafers by applying local pressures based on bow measurement of the two wafers.

Figure 1:
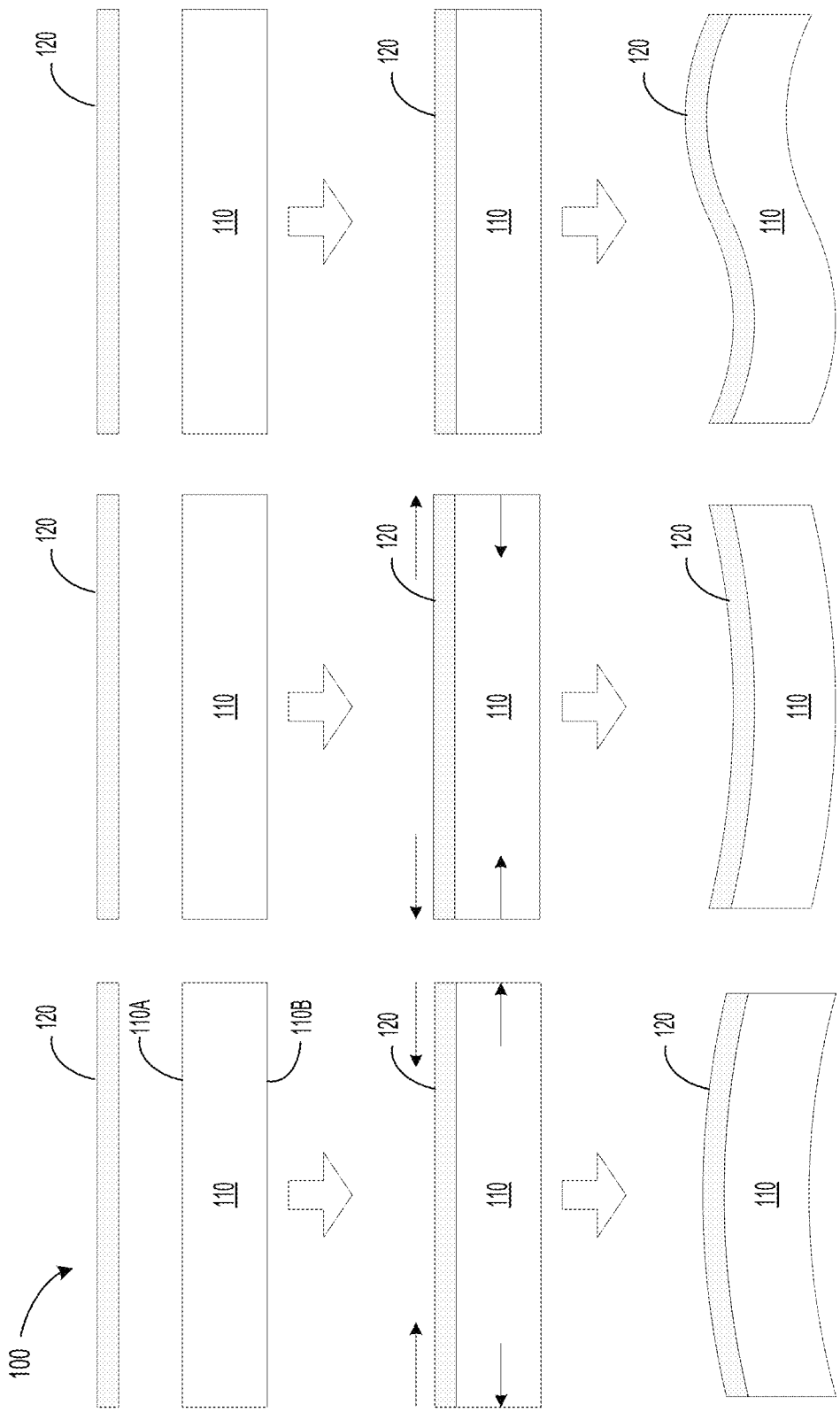
FIGS. 1A to 1C show first and second order bowing of a wafer.

Microfabrication of a semiconductor structure 100 begins with a flat substrate or wafer 110, as those illustrated in FIGS. 1A to 1C. During microfabrication of the semiconductor structure 100, multiple processing steps are executed that can include depositing material on the wafer 110, removing material, implanting dopants, annealing, baking, and so forth. Different materials and structural formations 120 thus formed can cause internal stresses in the wafer 110 which result in bowing of the semiconductor structure 100, which in turn affects overlay and typically results in overlay errors of various magnitudes. For example, FIGS. 1A and 1B show how the different materials and structural formations 120 can either induce a compressive or tensile stress in the wafer 110, respectively, resulting in first order bowing with bow measurements illustrating z-direction height deviations from a reference plane (not shown). As another example, FIG. 1C shows second order bowing of the wafer 110 with two bow measurements identifying positive and negative z-direction height deviations, respectively.

If some regions of two of the wafers 110 to be bonded to each other contain compressive stress or tensile stress, multiple pressure heads may be used to enable a localized pressure to make a more efficient bonding process and thus enhance die yield with optimum wafer shape. The opposite type of stress may be applied in each of the localized nano stress regions. By using an array of heat/light zones or locations on a wafer chuck to modify an internal stress of a stress-modification film, an optimum wafer shape can be achieved quickly and with minimal cost.

Figure 2:
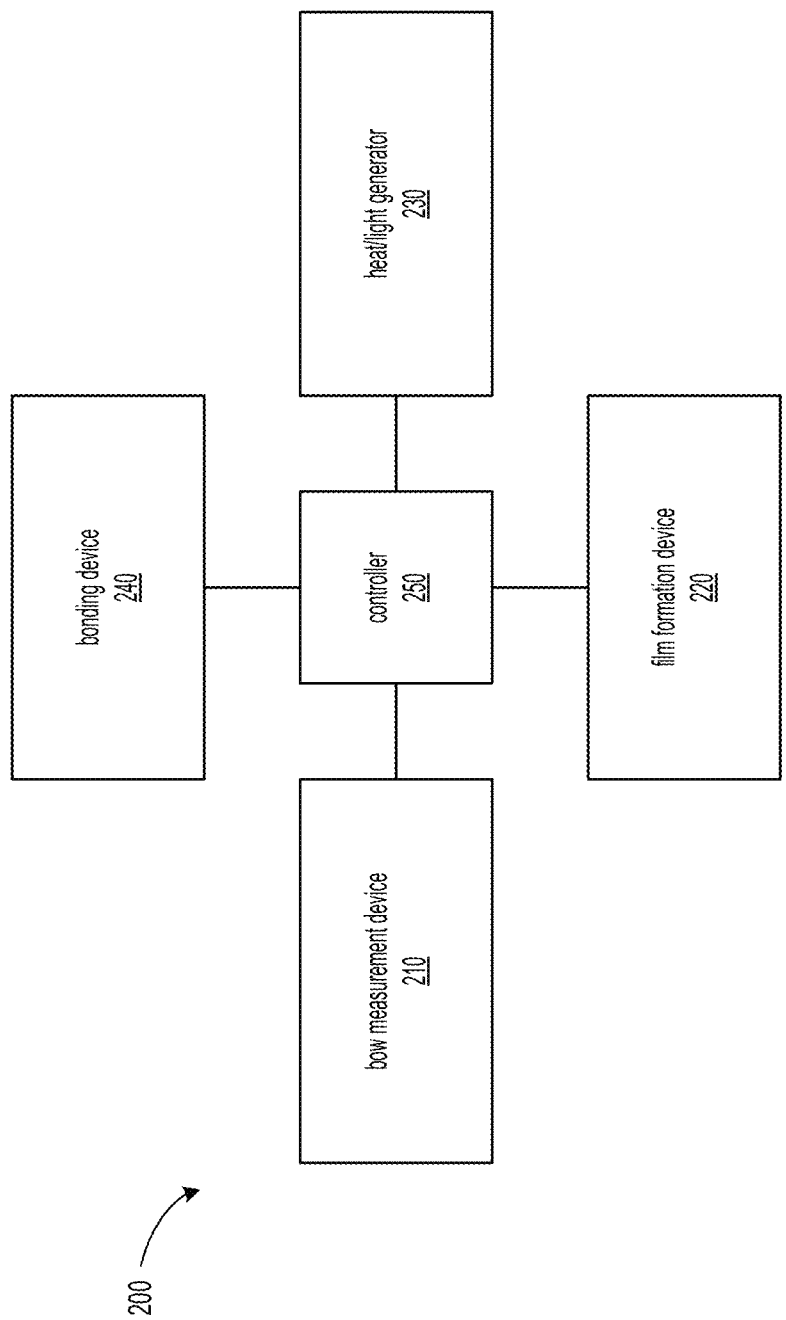
FIG. 2 is a functional block diagram of an exemplary system for bonding two wafers and/or dies in accordance to some embodiments of the present disclosure.

FIG. 2 is a functional block diagram of an exemplary system 200 for bonding two or more wafers and/or dies in accordance to some embodiments of the present disclosure. For example, the system 200 can include metrology equipment, e.g., a bow measurement device 210, which is configured to measure a substrate, a die or a wafer (e.g., the wafer 110 shown in FIGS. 1A-1C) to identify bow measurement of the wafer 110. In an embodiment, the bow measurement device 210 can use optical (e.g., using a scanning laser technique), acoustic and other mechanisms to measure the z-direction height deviations across a surface of the wafer 110 and store the height deviations by (x, y) coordinates in order to identify a plurality of sub-bow measurements (x, y) of the bow measurement. The z-direction height deviations can be mapped at various resolutions depending on type of metrology equipment used and/or a resolution desired. The bow measurement (and the sub-bow measurements as well) can include raw bow data, or be represented as a bow signature with relative values. In an embodiment, the wafer 110 has a working surface 110A, on which the different materials and structural formations 120 can be formed, and a backside surface 110B opposite to the working surface 110A, as shown in FIG. 1A. The wafer 110 may have an amount of wafer bow as a result from one or more micro fabrication processing steps that have been executed to create at least part of a semiconductor structure, e.g., the semiconductor structure 100, on the working surface 110A of the wafer 110. For example, transistor gates may be completed or only partially completed.

The system 200 can further include a deposition module, e.g., a film formation device 220, which is configured to deposit and form a film, e.g., a stress-modification film and a bonding film, on the backside surfaces 110B and/or the working surfaces 110A of the wafers 110 and/or dies. For example, the film formation device 220 can deposit the stress-modification film and the bonding film on the backside surface 110B and the working surface 110A of the wafer 110, respectively, by spin coating, laminating, spraying or other suitable deposition techniques. The stress-modification film, when exposed and reactive to heat/light, may have its internal stress modified by the heat/light. The film formation device 220 can be configured to form two or more stress-modification films of different, e.g., opposing, stresses. The bonding film can bond wafers and dies to each other.

Figure 3:
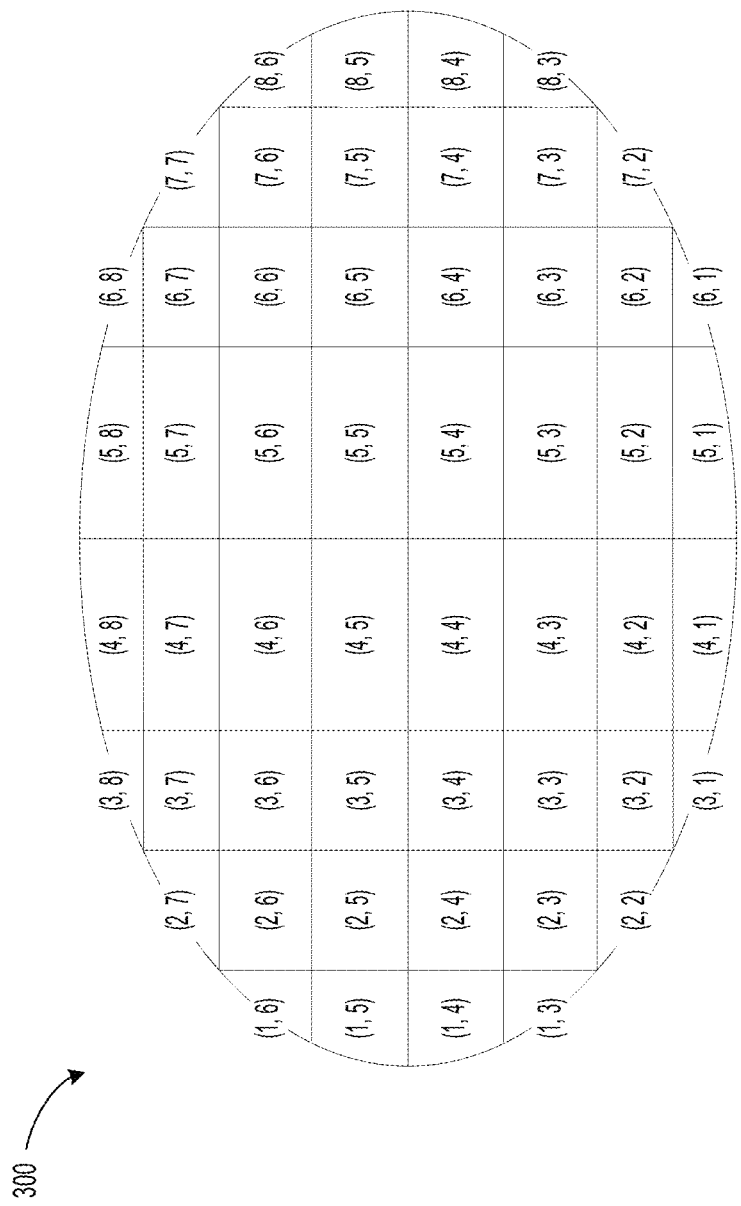
FIG. 3 shows an exemplary pattern of heat generated by a heat generator of the exemplary system shown in FIG. 2.

The system 200 can further include a heat/light generator 230, which is configured to generate a pattern of heat/light 300, as shown in FIG. 3. In an embodiment, the heat/light generator 230 can generate a laser, e.g., a direct laser write, and a plurality of wavelengths of light. In another embodiment, the heat/light generator 230 can include a plurality of heating/lighting units, which can be installed on a wafer chuck and have an arrangement corresponding to the pattern of heat/light 300. For example, the heat/light generator 230 can include heating/lighting units (3, 1) to (6, 1), (2, 2) to (7, 2), (1, 3) to (8, 3), (1, 4) to (8, 4), (1, 5) to (8, 5), (1, 6) to (8, 6), (2, 7) to (7, 7) and (3, 8) to (6, 8), a total of 52 heating/lighting units, and the bow measurement device 210 can measure the wafer 110 to identify bow measurement of the wafer 110, which include corresponding sub-bow measurements (3, 1) to (6, 1), (2, 2) to (7, 2), (1, 3) to (8, 3), (1, 4) to (8, 4), (1, 5) to (8, 5), (1, 6) to (8, 6), (2, 7) to (7, 7) and (3, 8) to (6, 8). The (Poseidon) micro pattern of heat/light 300 herein can eliminate the warp such that high resolution lithographic patterning can be maintained throughout all process steps for 3D stacking.

The heat/light generator (or the heat generator) 230 can generate a plurality of temperature ranges of heat. For example, the heat generator 230 can generate a first temperature range up to 200° C. of heat, a second temperature range between 200° ° C. and 500° C. of heat, a third temperature range between 500° C. and 800° ° C. of heat, and a fourth temperature range over 800° C. of heat.

Returning to FIG. 2, the system 200 can further include a bonding device 240 configured to apply pressures onto two wafers and/or dies, a surface, e.g., the working surface, of at least one of which has a bonding film formed thereon, to bond the two wafers and/dies to each other.

The system 200 can further include a controller 250, which is coupled to the bow measurement device 210, the film formation device 220, the heat/light generator 230 and the bonding device 240. The controller 250 can be configured to control the bow measurement device 210 to measure the wafers (and/or dies) 110 to identify the bow measurements (and the sub-bow measurements) of the wafers 110, control the film formation device 220 to form the stress-modification film(s) and/or the bonding film(s) on the backside surfaces 110B and/or the working surfaces 110A of the wafers 110, control the heat/light generator 230 to generate and apply the pattern of heat/light 300 onto the stress-modification film(s), the pattern of heat/light corresponding to the bow measurements (and the sub-bow measurements), and control the bonding device 240 to bond the two wafers 110 to each other. The controller 250 can be a computer processor located within the system 200, or located remotely but in communication with components of the system 200.

The system 200 can further include other components, such as a wafer chuck for a wafer to be placed thereon, a robot handler configured to flip the wafer 110 and transfer the wafers among various devices and/or chambers, a wafer clamper configured to clamp the wafer 110, a coating device configured to coat the backside surface 110B of the wafer 110 with a radiation-sensitive material, such as a photoresist, a bake device configured to bake the photoresist, an imaging device configured to expose the photoresist to an actinic radiation pattern, a development device configured to develop a latent image in the photoresist, and an etching device configured to use plasma or vapor-phase etching or wet etching.

Figure 4:
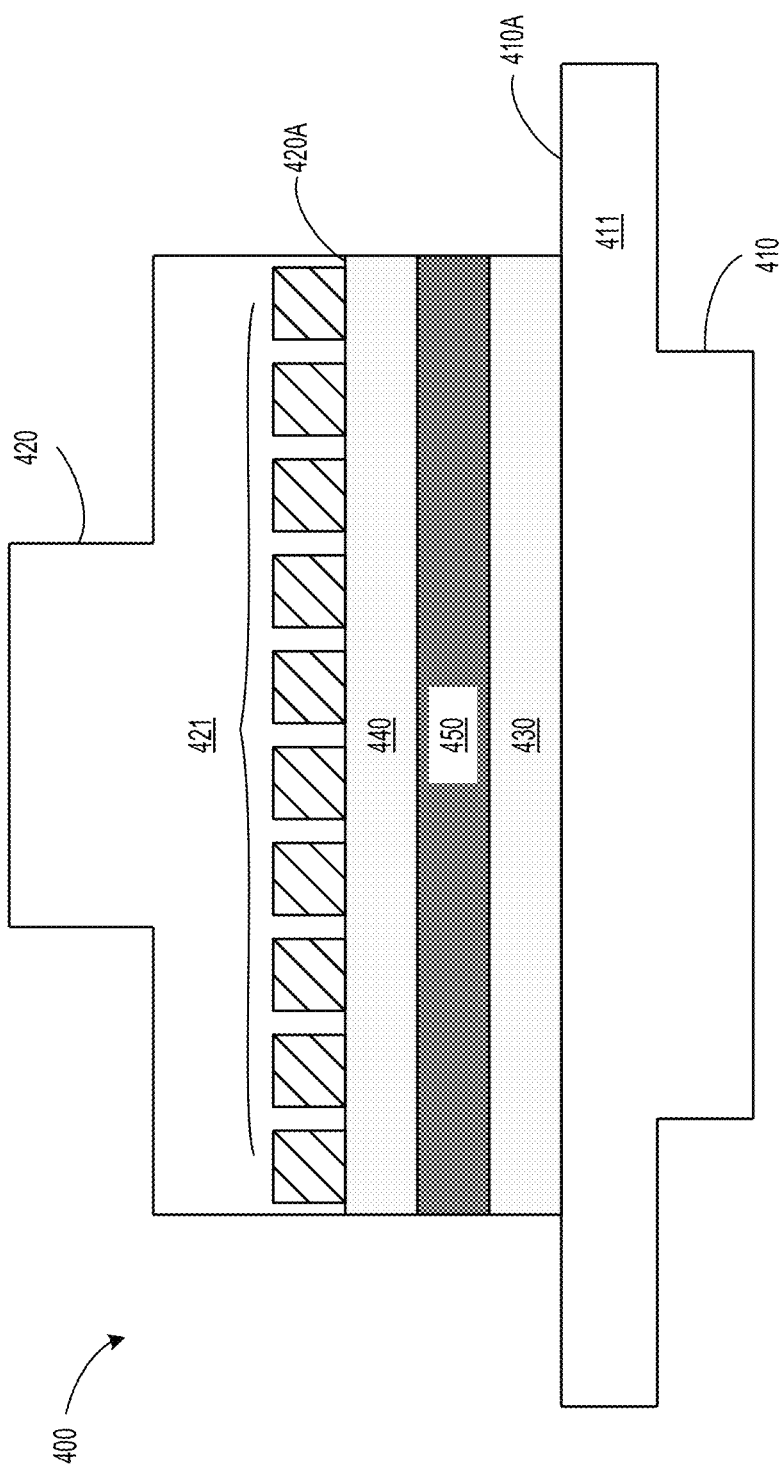
FIG. 4 is a schematic diagram of a first exemplary bonding device in accordance with some embodiments of the present disclosure.

FIG. 4 is a schematic diagram of an exemplary bonding device 400, e.g., the bonding device 240 of the system 200, in accordance with some embodiments of the present disclosure. In an embodiment, the bonding device 400 can include a bottom (or first) bonding chuck 410 and a top (or second) bonding chuck 420 that are controlled by a controller, e.g., the controller 250, to move toward and away from each other and apply pressures onto a first wafer 430 and a second wafer 440, e.g., the wafer 110, at least one of which has a bonding film 450 formed on a surface thereof, e.g., the working surface 110A, to bond the first wafer 430 and the second wafer 440 to each other. In an embodiment, the bonding film 450 can be insulative, and include epoxy, metal or a combination thereof.

In an embodiment, the bottom bonding chuck 410 can include a bottom bonding (or pressure) head 411, e.g., round, for the first wafer 430 to be mounted thereon. The bottom bonding head 411 can apply a global pressure (i.e., force/first wafer area) onto the first wafer 430. The bottom bonding chuck 410 can further include one or more holes or perforations (not shown) formed in a mounting surface 410A thereof. A vacuum system may be coupled to the bottom bonding chuck 410 and transfer a negative pressure through the holes or perforations to the first wafer 430 to hold the first wafer 430 in place in subsequent bonding process.

Figure 5:
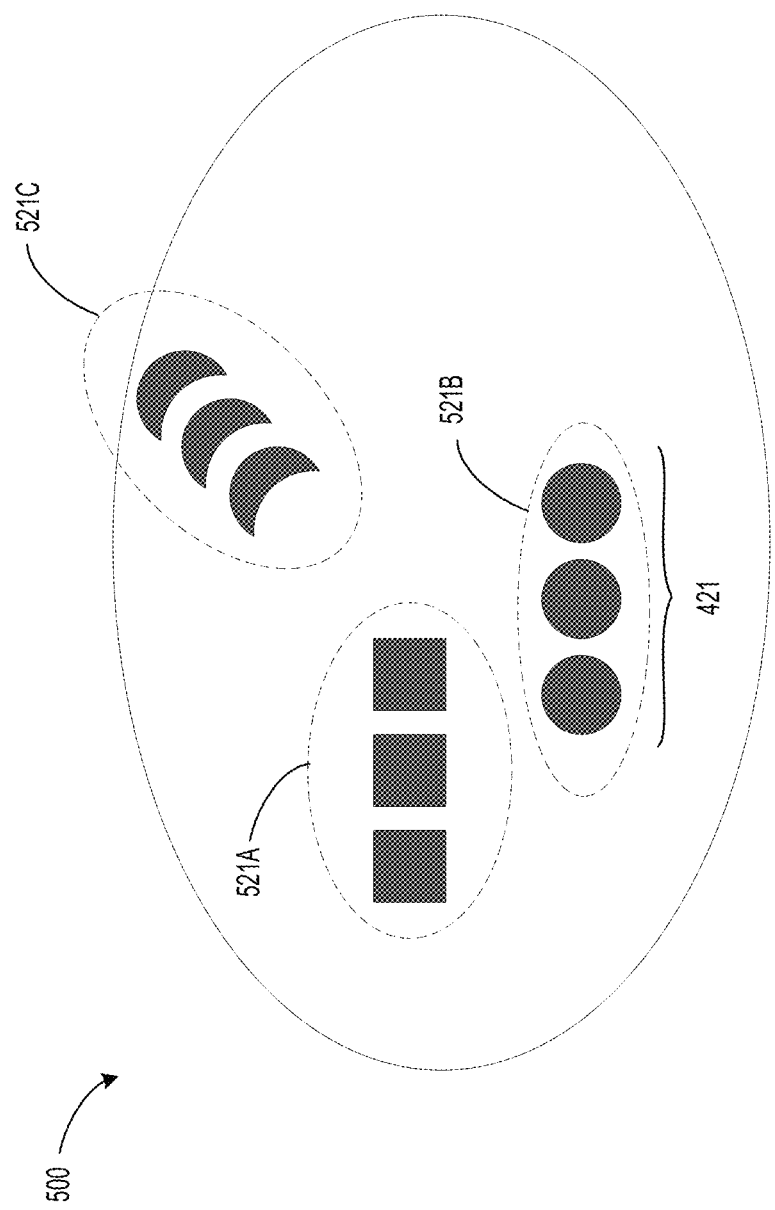
FIG. 5 shows the shapes of top bonding heads of the bonding device of FIG. 4 in accordance with some embodiments of the present disclosure.

In an embodiment, the top bonding chuck 420 can include a plurality of top bonding (or pressure) heads 421 for the second wafer 440 to be mounted thereon. For example, the top bonding heads 421 can be disposed in an arrangement that corresponds to the pattern of heat/light 300, for example, and be controlled by the controller 250 individually based on the bow measurement of the second wafer 440 to apply local pressures on the second wafer 440. The top bonding chuck 420 can also include one or more holes or perforations (not shown) formed in a mounting surface 420A thereof. A vacuum system may be coupled to the top bonding chuck 420 and transfer a negative pressure through the holes or perforations to the second wafer 440 to hold the second wafer 440 in place in subsequent bonding process. The top bonding heads 421 can be in various shapes. For example, a bonding device 500 can include a first group 521A of the top bonding heads 421 that are rectangular, e.g., square, a second group 521B of the top bonding heads 421 that are round, and a third group 521C of the top bonding heads 421 that are crescent, as shown in FIG. 5. In some embodiments, the heat/light generator 230 can include one or more groups of the heating/lighting units that have different shapes.

Figure 6:
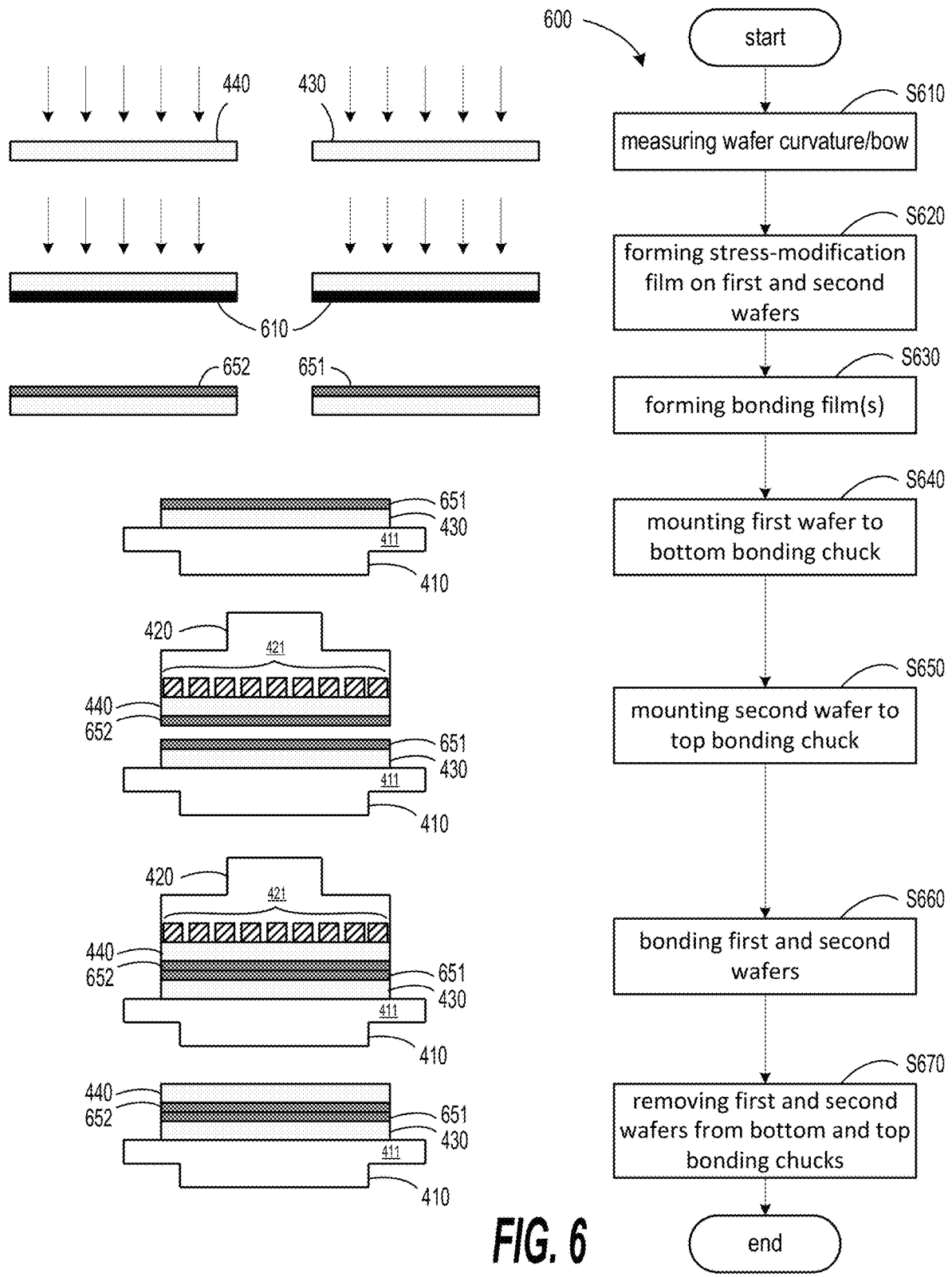
FIG. 6 shows a flow chart of a first exemplary method (or process flow) of bonding two wafers by using a bonding device in accordance with some embodiments of the present disclosure.

FIG. 6 shows a flow chart of an exemplary method (or process flow) 600 of bonding two wafers by using a bonding device in accordance with some embodiments of the present disclosure. In various embodiments, some of the steps of the method 600 shown can be performed concurrently or in a different order than shown, can be substituted by other method steps, or can be omitted. Additional method steps can also be performed as desired. Aspects of the method 600 can be implemented by a system, such as the system 200 illustrated in and described with respect to the preceding figures.

At step S610, the curvature/bow of first and second wafers 430 and 440 that are to be bonded to each other is measured. For example, the bow measurement device 210 can be used to measure the first wafer 430 and the second wafer 440 to identify the bow measurement of the first wafer 430 and the second wafer 440.

At step S620, optionally, a stress-modification film 610 can be formed on the backside surfaces of the first wafer 430 and the second wafer 440 and be exposed to heat/light, in order to have its internal stress modified by the heat/light to modify the curvature/bow of the first wafer 430 and the second wafer 440. For example, the film formation device 220 can be used to deposit and form the stress-modification film 610 on the backside surfaces of the first wafer 430 and the second wafer 440, and the heat/light generator 230 can be used to generate a pattern of heat/light based on the bow measurements of the first wafer 430 and the wafer 440 to modify the internal stress of the stress-modification film 610. The method 600 can then return to step S610 to measure the curvature/bow of the first wafer 430 and the second wafer 440 with the stress-modification film 610 formed the backside surfaces thereof.

At step S630, which follows step S610 or step S620, a bonding film, e.g., the bonding film 450, can be formed on the working surface of at least one of the first wafer 430 and the second wafer 440. In the example embodiment, a first bonding film 651 and a second bonding film 652 can be formed on the working surfaces of the first wafer 430 and the second wafer 440, respectively. For example, the film formation device 220 can be used to deposit and form the first bonding film 651 on the working surface of the first wafer 430 and the second bonding film 652 on the working surface of the second wafer 440 sequentially.

At step S640, the first wafer 430 with the first bonding film 651 formed on the working surface thereof is mounted onto the bottom bonding head 411 of the bottom bonding chuck 410. The vacuum system can then be turned on to transfer a negative pressure through the holes or perforations in the mounting surface 410A (shown in FIG. 4) to the first wafer 430 to hold the first wafer 430 in place in subsequent bonding process.

As step S650, the second wafer 440 with the second bonding film 652 formed on the working surface thereof is mounted onto the top bonding heads 421 of the top bonding chuck 420. The vacuum system can transfer a negative pressure through the holes or perforations in the mounting surface 420A (shown in FIG. 4) to the second wafer 440 to hold the second wafer 440 in place in subsequent bonding process. In an embodiment, step S640 and step S650 can be performed in a different order.

At step S660, the first wafer 430 and the second wafer 440 are bonded to each other. For example, the controller 250 can control the bottom bonding chuck 410 and the top bonding chuck 420 to be aligned and move toward each other until the first bonding film 651 is in contact with the second bonding film 652, and control the bottom bonding head 411 to apply the global pressure onto the first wafer 430 and the top bonding heads 421 to apply the local pressures onto the second wafer 440 based on the bow measurement of the second wafer 440 to bond the second bonding film 652 to the first bonding film 651 and thus the second wafer 440 to the first wafer 430. In an embodiment, bonding techniques of the first bonding film 651 and the second bonding film 652 can include direct bonding, anodic bonding, adhesive bonding, soldering bonding, eutectic bonding, etc.

At step S670, the bonded first wafer 430 and the second wafer 440 are removed from the bottom bonding chuck 410 and the second bonding chuck 420, respectively, for subsequent processing options, e.g., dicing into dies. For example, the vacuum system can be turned off and the bonded first wafer 430 and the second wafer 440 can be released from the holding of the bottom bonding chuck 410 and the second bonding chuck 420, respectively. The first wafer 430 and the second wafer 440 thus bonded have optimum wafers shape.

Figure 7:
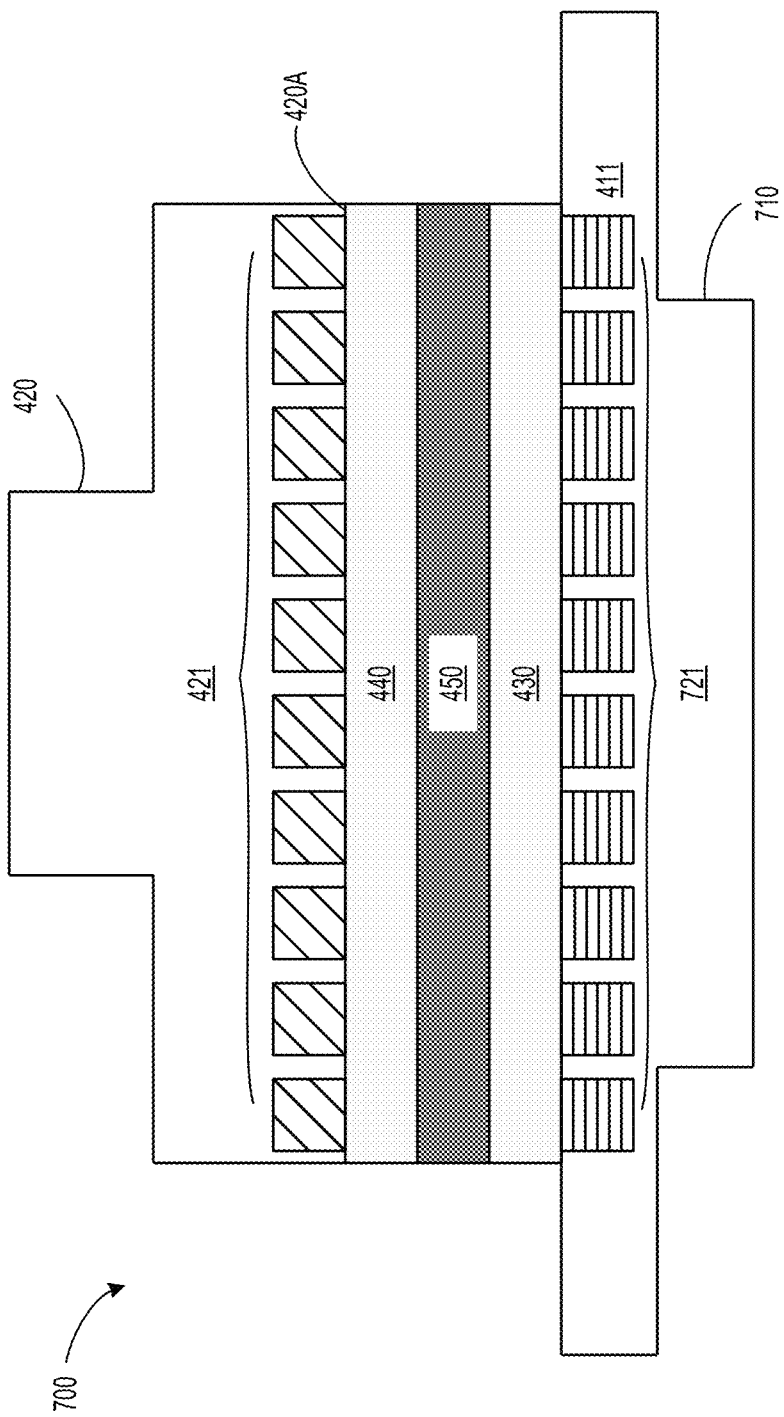
FIG. 7 is a schematic diagram of a second exemplary bonding device in accordance with some embodiments of the present disclosure.

FIG. 7 is a schematic diagram of an exemplary bonding device 700, e.g., the bonding device 240 of the system 200, in accordance with some embodiments of the present disclosure. The bonding device 700 can include the top bonding chuck 420 and a bottom bonding chuck 710. Compared with the bottom bonding chuck 410 of the bonding device 400 shown in FIG. 4, the bottom bonding chuck 710 of the bonding device 700 further includes one or more heating units 721 that are disposed in the bottom bonding head 411 and controlled by the controller 250 to provide heat to cure the bonding film 450.

Figure 8:
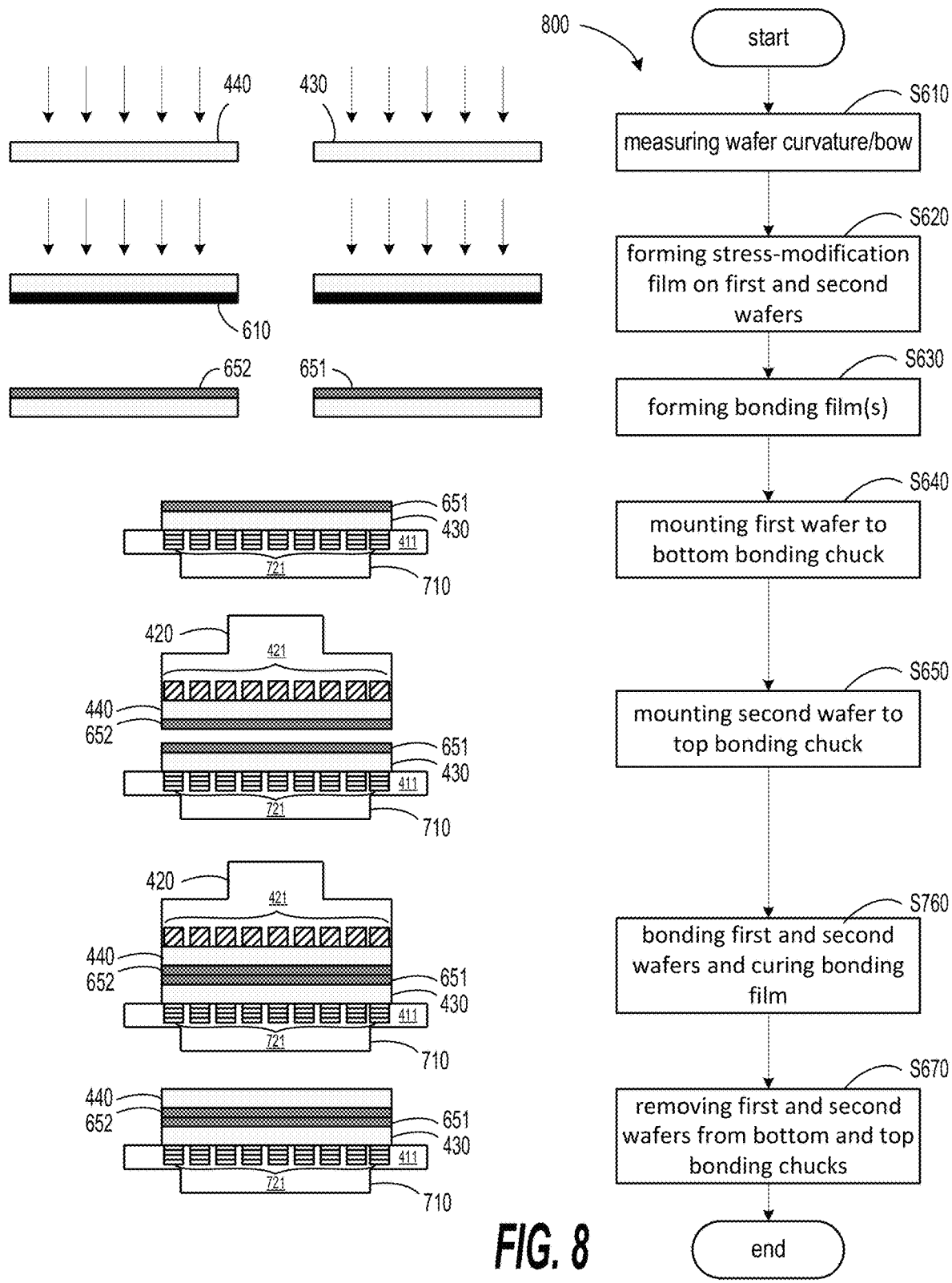
FIG. 8 shows a flow chart of a second exemplary method (or process flow) of bonding two wafers by using a bonding device in accordance with some embodiments of the present disclosure.

FIG. 8 shows a flow chart of an exemplary method (or process flow) 800 of bonding two wafers by using a bonding device, e.g., the bonding device 700, in accordance with some embodiments of the present disclosure. Aspects of the method 800 can be implemented by a system, such as the system 200 illustrated in and described with respect to the preceding figures. The method 800 can also include steps S610-S650 and S670 of the method 600. In an embodiment, the method can further include step S760, which is performed between steps S650 and S670. At step S760, the first wafer 430 and the second wafer 440 are bonded to each other. For example, the controller 250 can control the bottom bonding chuck 710 and the top bonding chuck 420 to be aligned and move toward each other until the first bonding film 651 is in contact with the second bonding film 652, control the bottom bonding heads 411 to apply the global pressure onto the first wafer 430 and the top bonding heads 421 to apply the local pressures onto the second wafer 440 based on the bow measurement of the second wafer 440, and control the heating units 721 to provide heat to cure the first bonding film 651 and the second bonding film 652 to bond the second bonding film 652 to the first bonding film 651 and thus the second wafer 440 to the first wafer 430.

Figure 9:
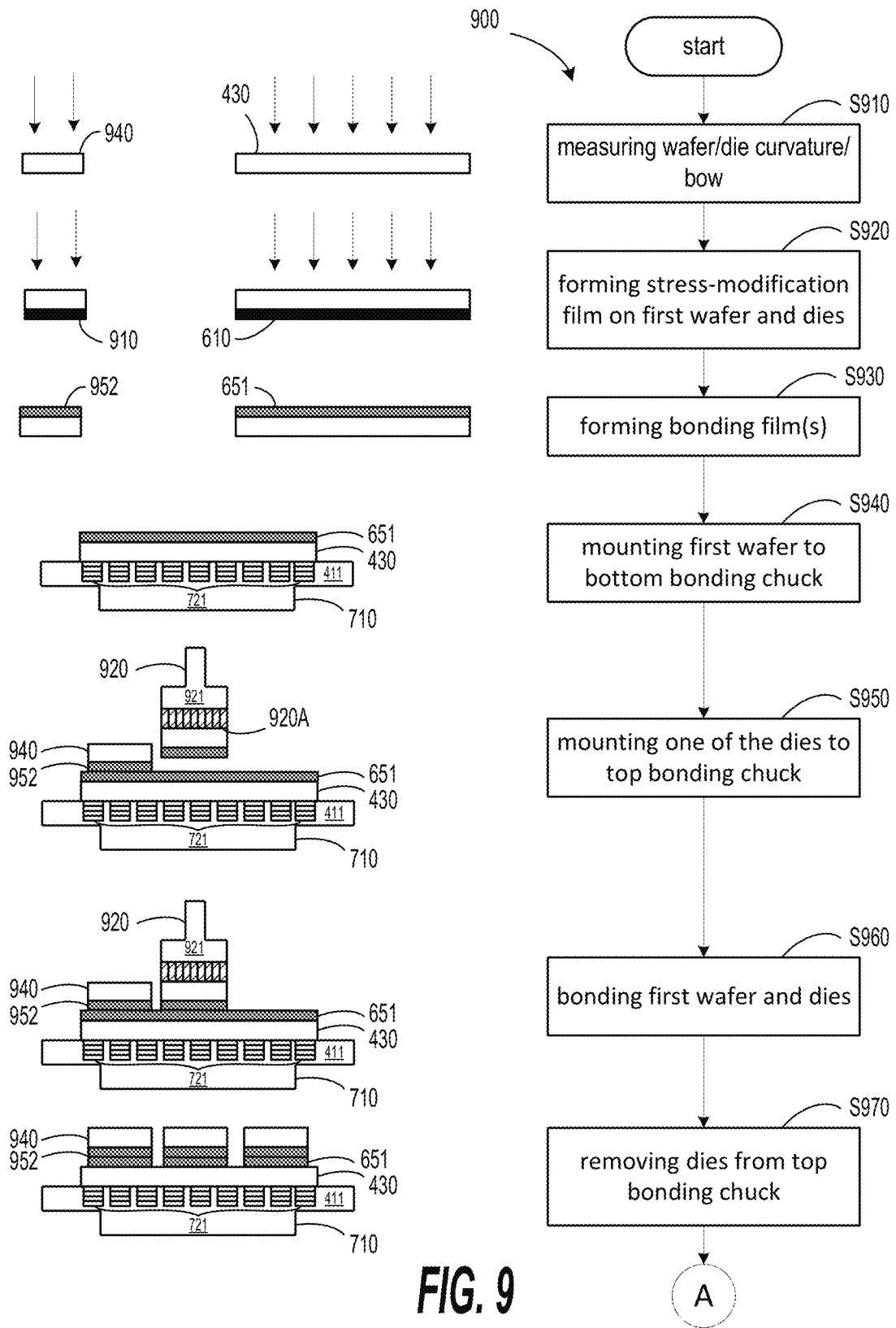
FIG. 9 shows a flow chart of a third exemplary method (or process flow) of bonding two wafers by using a bonding device in accordance with some embodiments of the present disclosure.
Figure 9:
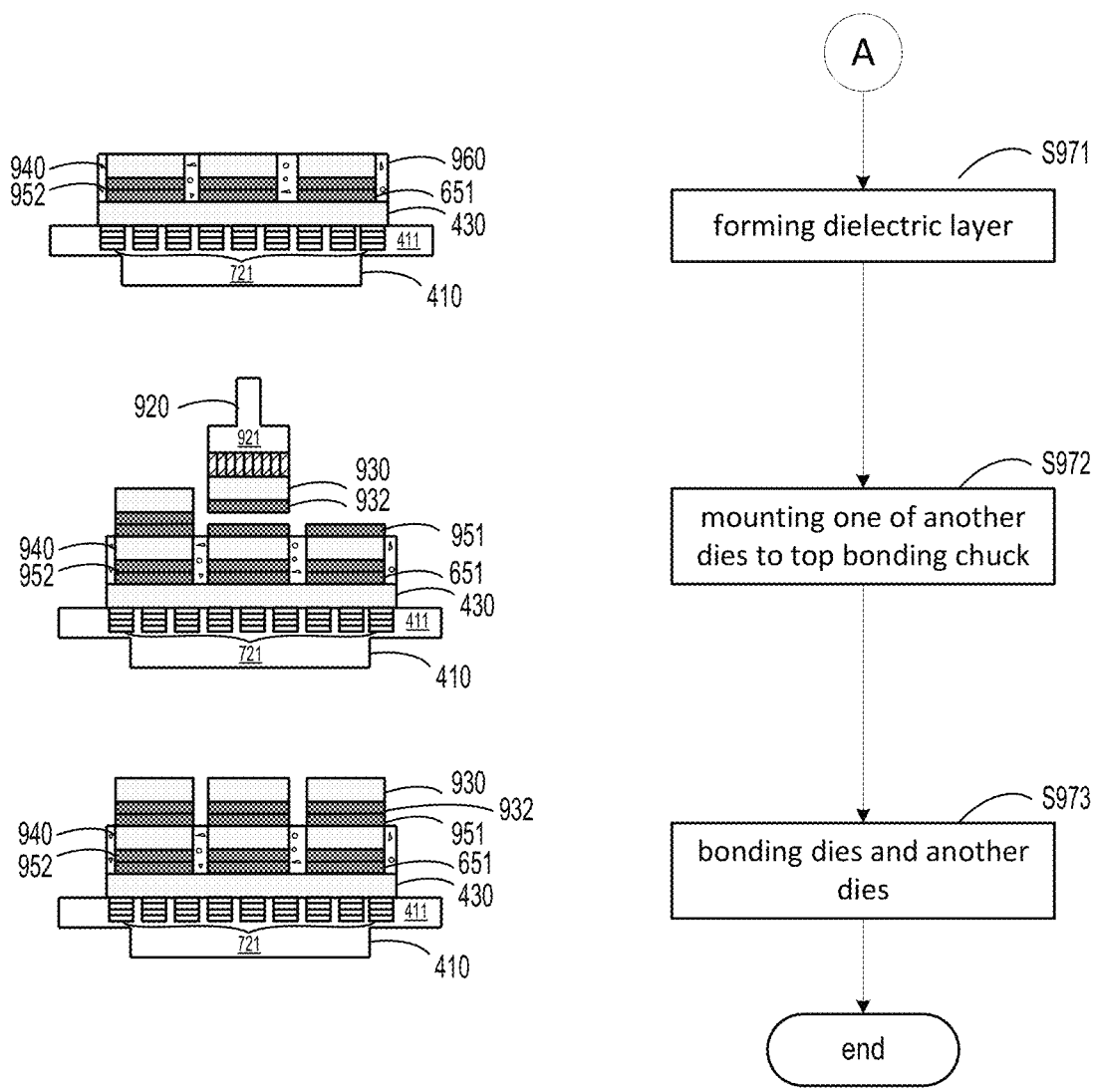

FIG. 9 shows a flow chart of an exemplary method (or process flow) 900 of bonding a plurality of dies to a wafer by using a bonding device in accordance with some embodiments of the present disclosure. Aspects of the method 900 can be implemented by a system, such as the system 200 illustrated in and described with respect to the preceding figures. The method 900 differs from the method 800 in that in the method 900 a top bonding chuck 920 and a plurality of dies 940 replace the top bonding chuck 420 and the second wafer 440 used in the method 800 shown in FIG. 8.

At step S910, the curvature/bow of the first wafer 430 and the dies 940 that are to be bonded to each other is measured. For example, the bow measurement device 210 can be used to measure the first wafer 430 and each of the dies 940 to identify the bow measurement of the first wafer 430 and the dies 940.

At step S920, optionally, the stress-modification film 610 and a stress-modification film 910 can be formed on the backside surfaces of the first wafer 430 and the dies 940 and be exposed to heat/light, in order to have their internal stresses modified by the heat/light to modify the curvature/bow of the first wafer 430 and the dies 940. For example, the film formation device 220 can be used to deposit and form the stress-modification films 610 and 910 on the backside surfaces of the first wafer 430 and the dies 940, respectively, and the heat/light generator 230 can be used to generate a pattern of heat/light based on the bow measurements of the first wafer 430 and each of the dies 440 to modify the internal stresses of the stress-modification films 610 and 910. The method 900 can then return to step S910 to measure the curvature/bow of the first wafer 430 and the dies 940 with the stress-modification films 610 and 910 formed on the backside surfaces thereof.

At step S930, which follows step S910 or step S920, a bonding film, e.g., the bonding film 450, can be formed on the working surface(s) of the first wafer 430 and/or the dies 940. In the example embodiment, the first bonding film 651 and a second bonding film 952 can be formed on the working surfaces of the first wafer 430 and the dies 940, respectively. For example, the film formation device 220 can be used to deposit and form the first bonding film 651 on the working surface of the first wafer 430 and the second bonding film 952 on the working surfaces of the dies 940 sequentially.

At step S940, the first wafer 430 with the first bonding film 651 formed on the working surface thereof is mounted onto the bottom bonding head 411 of the bottom bonding chuck 710 (or the bottom bonding chuck 410). The vacuum system can then be turned on to transfer a negative pressure through the holes or perforations in the mounting surface 410A (shown in FIG. 4) to the first wafer 430 to hold the first wafer 430 in place in subsequent bonding process.

As step S950, the dies 940 with the second bonding film 952 formed on the working surfaces thereof are mounted onto top bonding heads 921 of a top bonding chuck 920 one by one. In an embodiment, the top bonding heads 921 can be disposed in an arrangement that corresponds to the pattern of heat/light 300, for example, and be controlled by the controller 250 individually based on the bow measurement of the dies 440. The top bonding chuck 920 can also include one or more holes or perforations (not shown) formed in a mounting surface 920A thereof. A vacuum system may be coupled to the top bonding chuck 920 and transfer a negative pressure through the holes or perforations to each of the dies 940 to hold the dies 940 in place in subsequent bonding process. The top bonding heads 921 can be in various shapes. In step S950, the vacuum system can be turned on and transfer a negative pressure through the holes or perforations in the mounting surface 920A to the dies 940 to hold the dies 940 in place in subsequent bonding process. In an embodiment, step S940 and step S950 can be performed in a different order.

At step S960, the first wafer 430 and one of the dies 940 are bonded to each other. For example, the controller 250 can control the bottom bonding chuck 410 and the top bonding chuck 920 to be aligned and move toward each other until the first bonding film 651 is in contact with the second bonding film 952, and control the bottom bonding head 411 to apply the global pressure onto the first wafer 430 and the top bonding heads 921 to apply the local pressures onto the die 940 based on the bow measurement of the die 940 to bond the second bonding film 952 to the first bonding film 651 and thus the die 940 to the first wafer 430.

At step S970, the dies 940 are removed from the top bonding chuck 920, for subsequent processing options, e.g., bonding another dies. For example, the vacuum system can be turned off and the last one of the dies 940 can be released from the holding of the top bonding chuck 920. The first wafer 430 and the dies 940 thus bonded have optimum wafers/dies shape.

At step S971, a portion of the first bonding film 651 that is not bonded to the second bonding film 952 can be etched and removed, and replaced with a dielectric layer 960 that separates and insulates the dies 940 from one another.

At step S972, the curvature/bow of each of another plurality of dies 930 that are to be bonded to the dies 940 is measured, a first bonding film 951 and a second bonding film 932 are formed on the backside surfaces of the dies 940 and the another dies 930, respectively, the another dies 930 are mounted onto the top bonding heads 921 of the top bonding device 920, and the top bonding device 920 and the bottom bonding device 410 are controlled to be aligned and move toward to each other, in order to bond the first bonding film 951 and the second bonding film 932 to each other.

At step S973, the dies 940 and the another dies 930 are bonded to each other. For example, the controller 250 can control the bottom bonding chuck 410 and the top bonding chuck 920 to be aligned and move toward each other until the first bonding film 951 is in contact with the second bonding film 932, and control the bottom bonding head 411 to apply the global pressure onto the dies 940 and the top bonding heads 921 to apply the local pressures onto the another die 930 based on the bow measurement of the another die 930 to bond the second bonding film 932 to the first bonding film 951 and thus the dies 940 to the another dies 930.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A system for bonding two wafers, comprising:
a bow measurement device configured to measure a first wafer and a second wafer to identify bow measurement of the first wafer and the second wafer;
a bonding device configured to bond the first wafer to the second wafer;
a controller coupled to the bow measurement device and the bonding device, the controller configured to control the bonding device to apply pressures onto the first wafer and the second wafer based on the bow measurement to bond the first wafer to the second wafer; and
a film formation device coupled to the controller, the film formation device configured to form a bonding film on first surfaces of the first wafer and the second wafer, wherein
the system further comprises a heat generator coupled to the controller, the heat generator configured to generate a pattern of heat, the film formation device is further configured to form first and second stress-modification films on second surfaces of the first wafer and the second wafer, respectively, the first and second stress-modification films reactive to heat such that applied heat modifies internal stresses of the first and second stress-modification films, the bow measurement device is further configured to measure the first wafer and the second wafer, with the first and second stress-modification films on the second surfaces thereof, respectively, and having their internal stress modified, to identify the bow measurement of the first wafer and the second wafer, the bow measurement device is further configured to measure the first wafer and the second wafer, without any stress-modification film formed on the second surfaces thereof, to identify another bow measurement of the first wafer and the second wafer, and the controller is further configured to control the heat generator to generate and apply the pattern of heat onto the first and second stress-modification films, the pattern of heat corresponding to the another bow measurement, or the system further comprises a light generator coupled to the controller, the light generator configured to generate a pattern of first and second wavelengths of light, the film formation device is further configured to form first and second stress-modification films on second surfaces of the first wafer and the second wafer, respectively, the first and second stress-modification films reactive to the first and second wavelengths of light, respectively, such that exposure to the first and second wavelengths of light modifies internal stresses of the first and second stress-modification films, respectively, the bow measurement device is further configured to measure the first wafer and the second wafer, with the first and second stress-modification films formed on the second surfaces thereof, respectively, and having their internal stresses modified, to identify the bow measurement of the first wafer and the second wafer, the bow measurement device is further configured to measure the first wafer and the second wafer, without any stress-modification film formed on the second surfaces thereof, to identify another bow measurement of the first wafer and the second wafer, and the controller is further configured to control the light generator to generate and apply the pattern of first and second wavelengths of light onto the first and second stress-modification films, respectively, the pattern of first and second wavelengths of light corresponding to the another bow measurement.

2. The system of claim 1, wherein the second wafer is a die.

3. A method for bonding two wafers, comprising, receiving a first wafer and a second wafer;
measuring the first wafer and the second wafer to identify bow measurement of the first wafer and the second wafer,
applying pressures onto second surfaces of the first wafer and the second wafer based on the bow measurement of the first wafer and the second wafer to bond the first wafer to the second wafer; and
forming a bonding film on a first surface of the first wafer
wherein
the method further comprises measuring the first wafer, without any stress-modification film formed on a second surface thereof, to identify another bow measurement of the first wafer, forming a stress-modification film on the second surface of the first wafer, the stress-modification film reactive to heat such that applied heat modifies an internal stress of the stress-modification film, and applying a pattern of heat onto the stress-modification film to modify the internal stress of the stress-modification film, the pattern of heat corresponding to the another bow measurement, wherein measuring the first wafer and the second wafer to identify the bow measurement of the first wafer and the second wafer includes measuring the first wafer and the second wafer, with the stress-modification film formed on the second surface of the first wafer and having its internal stress modified, to identify the bow measurement of the first wafer and the second wafer, or the method further comprises measuring the first wafer, without any stress-modification film formed on a second surface thereof, to identify another bow measurement of the first wafer, forming a stress-modification film on the second surface of the first wafer, the stress-modification film reactive to a wavelength of light in that exposure to the wavelength of light modifies an internal stress of the stress-modification film, and applying a pattern of wavelength of light onto the stress-modification film to modify the internal stress of the stress-modification film, the pattern of wavelength of light corresponding to the another bow measurement, wherein measuring the first wafer and the second wafer to identify the bow measurement of the first wafer and the second wafer includes measuring the first wafer and the second wafer, with the stress-modification film formed on the second surface of the first wafer and having its internal stress modified, to identify the bow measurement of the first wafer and the second wafer.

4. The method of claim 3, wherein the first wafer is a die.

5. The method of claim 4, further comprising:
measuring another die to identify another bow measurement of the another die; and
applying another pressures onto a first surface of the another die based on the another bow measurement to bond the another die to the die.

6. The method of claim 4, further comprising:
measuring another die to identify another bow measurement of the another die; and
applying another pressures onto a first surface of the another die based on the another bow measurement to bond the another die to the second wafer.

7. A bonding device for bonding two wafers, comprising:
a first bonding chuck having a first bonding head for a first wafer to be mounted thereon; and
a second bonding chuck having a plurality of second bonding heads for a second wafer to be mounted thereon, the second bonding heads configured to be controlled individually to apply local pressures onto the second wafer to move the second wafer toward the first wafer to bond the second wafer to the first wafer, the local pressures corresponding to bow measurement of the first wafer and the second wafer,
wherein
the first bonding chuck further includes one or more heating units that are disposed in the first bonding head, the heating units configured to provide heat to cure a bonding film that is used to bond the first wafer to the second wafer, or
a first one of the second bonding heads is in a first shape, and a second one of the second bonding heads is in a second shape different from the first shape.

8. The bonding device of claim 7, wherein the first bonding head applies a global pressure onto the first wafer to move the first wafer toward the second wafer to bond the first wafer to the second wafer.

9. The bonding device of claim 7, wherein the second wafer is a die, and the second bonding heads are disposed in an arrangement that is sized to the die.

10. The bonding device of claim 7, wherein the first shape is round.

11. The bonding device of claim 7, wherein the first shape is rectangular.

12. The bonding device of claim 7, wherein the first shape is crescent.

* * * * *